US005943560A

United States Patent [19]
Chang et al.

[11] Patent Number: 5,943,560
[45] Date of Patent: Aug. 24, 1999

[54] METHOD TO FABRICATE THE THIN FILM TRANSISTOR

[75] Inventors: Chun-Yen Chang; Tan-Fu Lei; Hsiao-Yi Lin; Juing-Yi Cheng, all of Hsinchu, Taiwan

[73] Assignee: National Science Council, Taipei, Taiwan

[21] Appl. No.: 08/635,016

[22] Filed: Apr. 19, 1996

[51] Int. Cl.$^6$ .................................................. H01L 21/336
[52] U.S. Cl. ........................... 438/151; 438/164; 438/488
[58] Field of Search ................................. 437/21, 40 TFT, 437/41 TFT, 233, 967, 228 POL; 438/151, 164, 488, 491, 692

[56] References Cited

U.S. PATENT DOCUMENTS

| 4,905,072 | 2/1990 | Komatsu et al. . |
| 5,073,408 | 12/1991 | Goda et al. .............................. 427/169 |
| 5,242,530 | 9/1993 | Batey et al. ............................... 437/89 |
| 5,354,700 | 10/1994 | Huang et al. ...................... 437/40 TFT |
| 5,461,250 | 10/1995 | Burghatz et al. ........................ 257/347 |

FOREIGN PATENT DOCUMENTS

| 59-104170 | 6/1984 | Japan . |
| 6-163588 | 6/1994 | Japan . |

OTHER PUBLICATIONS

Nagayama, et al., A New Process for Silica Coating, J. Electronchem Soc., 1988, Vo. 135, No. 8, pp. 2013–2016.
King, et al., A Polycrystalline–Si$_{1-x}$Ge$_x$–Gate CMOS Technology, IDEM Tech. Dig., 1990, pp. 253–256.
M. Cao et al., IDRC Oct. 1994 proceedings, pp. 294–297.
Translation of JP 6–163588, Jun. 1994.
C.–Y. Chang et al. IEEE Electron Dev. Lett. 17(3)(Mar. 6, 1996) 100.
M. Cao et al., IDRC Oct. 1994 Proc. Abstract, pp. 294–297, "A low thermal budget polysilicon thin film transistor using chemical mechanical polishing".
H.–C. Lin et al., Appl. Phys. Lett. 63(10)(Sep. 1993) 1351 "Growth of undoped polycrystalline Si by an UHVCVD system".
H.–C. Lin et al., Appl. Phys. Lett. 65(13)(Sep. 1994) 1700 "Fabrication of ,,, TFTs by UHVCVD".
H.–Y. Lin et al., Solid State Electron. 38(12)(Dec. 1995)2029 "Characteristics of polycrystalline films grown by UHVCVD system".
R.J. Stroh et al., IEE Proc. Circuits Dev. Syst. 141(1)(Feb. 1994)9 "Low temperature (<600C) polysilicon thin–film transistors".

*Primary Examiner*—Charles Bowers
*Assistant Examiner*—Martin Sulsky
*Attorney, Agent, or Firm*—Beveridge, DeGrandi, Weilacher & Young L.L.P.

[57] ABSTRACT

Ultrahigh vacuum chemical vapor deposition (UHV/CVD) and chemical mechanical polishing (CMP) systems are used in a method which can fabricate polycrystalline silicon (poly-Si) and polycrystalline silicon-germanium (poly-Si$_{1-x}$-Ge$_x$) thin film transistors at low temperature and low thermal budget. Poly-Si and poly-Si$_{1-x}$-Ge$_x$ can be deposited by UHV/CVD without any anneal step. And due to the ultra low base pressure and ultraclean growth environment, the As-deposited poly films have low defect densities. However, the surface morphology retards the usage of the fabricating top-gate poly TFT's. In this invention, the CMP system is used for improving the surface morphology, high performance poly-Si and poly-Si$_{1-x}$-Ge$_x$ TFT's can be obtained.

6 Claims, 6 Drawing Sheets

METHOD TO FABRICATE THE THIN FILM TRANSISTOR

FIELD OF THE INVENTION

This invention relates to the thin film transistor.

DESCRIPTION OF THIS INVENTION

BACKGROUND OF THE INVENTION

H. Kawahara et. al. have reported a liquid phase deposition method which can grow the $SiO_2$ under less than 50° C. condition in the J. Electronchem Soc., 1988, Vol. 135, no.8, pp2013–16. This method obtained the U.S. Pat. No. 5,073,408. It was originally used to grow the cover film of the glass substrate which will prevent the Sodium ion existing in the glass from dispersing outwardly and avoid destroying the grown liquid crystall display(LCD) on the surface of to substrate. This LPD method provides advantages including simple facility, inexpensive manufactured cost, low-temperature preparation process and the grown Silicon oxide film possess good quality. In addition, it possesses selective deposition capability.

In conventional, the preparations of the poly-Si and poly-$Si_{1-x}$-$Ge_x$ film transistor were studied elsewhere, T.J. King et.al. depicted the application of the low pressure chemical vapor deposition (LPCVD) in IDEM Tech. Dig., 1990, pp. 253–256. At first, a amorpous silicon film layer deposed on the surface of glass under the low temperature condition, and then the annealing treatment last for 24 to 72 hours, finally, the poly-Si can be formed. This method spent much more time, not only raising the manufactured cost but accumulating a lot of energy within the products. In addition, the growth chamber cleanness of the general LPCVD system is bad, thus, the quality of the grown poly-Si and poly-$Si_{1-x}$-$Ge_x$ could not compare with that of grown in the ultrahigh vacuum chemical vapor deposition (UHV/CVD) system. Although the laser annealing treatment can be used for making the amorphous Si to be the poly-Si under the low temperature. However, the prepared poly-Si film transistor using this method possesses good characteristics, the whole uniformity and the feasibility of the mass manufacture still have some problems that should be further solved. Therefore, the laser anneal method is not a complete method yet until now. On the other hand, a developed latest method that is assisted by the catalyzer is applied for the poly-Si growth, the metal wire is loaded into the cold wall growing chamber and heated to the growth temperature, and then the conventional LPCVD system is adapted, the annealing treatment step can be omitted.

In this invention, the usefulness of the ultrahigh vacuum chemical vapor deposition(UHV/CVD) and chemical mechanical polishing (CMP) systems to fabricate directly the polycrystalline silicon (poly-Si) and polycrystalline silicon-germanium (poly-$Si_{1-x}$-$Ge_x$) thin film transistors under low temperature, 550 ° C. and the CMP system is used also for improving the surface morphology.

The main purpose of this invention is to provide a novel method for fabricating the poly-Si and poly-$Si_{1-x}$-$Ge_x$ thin film transistors at low temperature and low thermal budget. And the high performance poly-Si and poly-$Si_{1-x}$-$Ge_x$ transistors can be prepared without any anneal treatment step.

BRIEF DESCRIPTION OF THE DRAWINGS

Other objects, features and advantages of the invention will be apparent from the following detailed descriptions in connection with the accompanying drawings, in which.

REFERENCE NUMBER OF ELEMENTS IN THE DRAWINGS

Figure 1A:
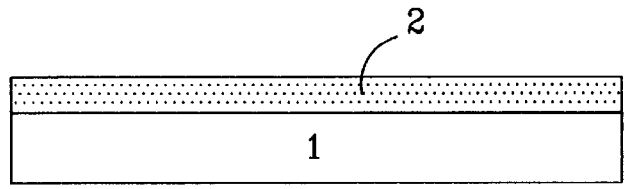
FIGS. 1A and 1B. the process diagram of a method to fabricate the thin film transistor in this invention.
Figure 1A:
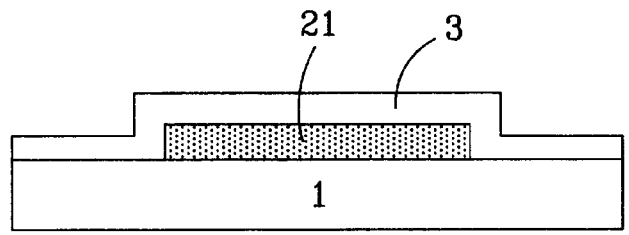
Figure 1A:
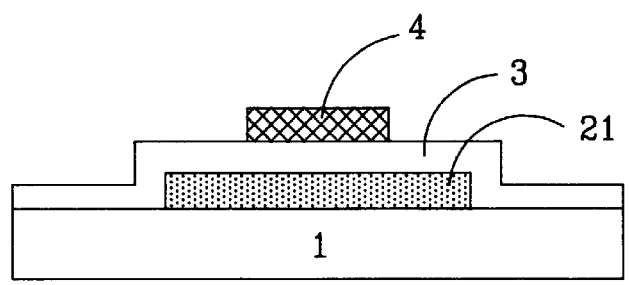
Figure 1A:
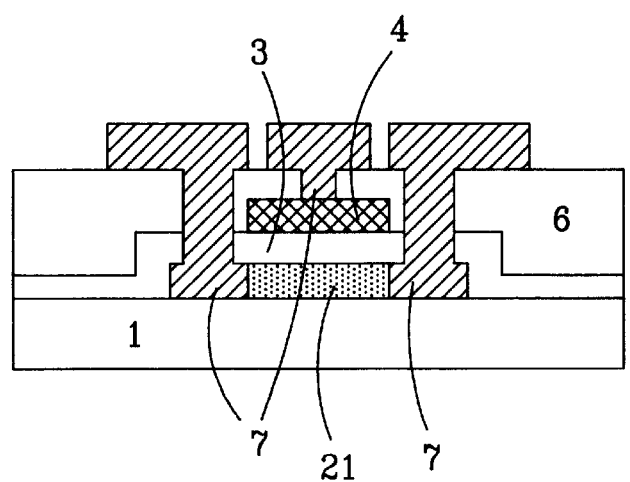
Figure 1B:
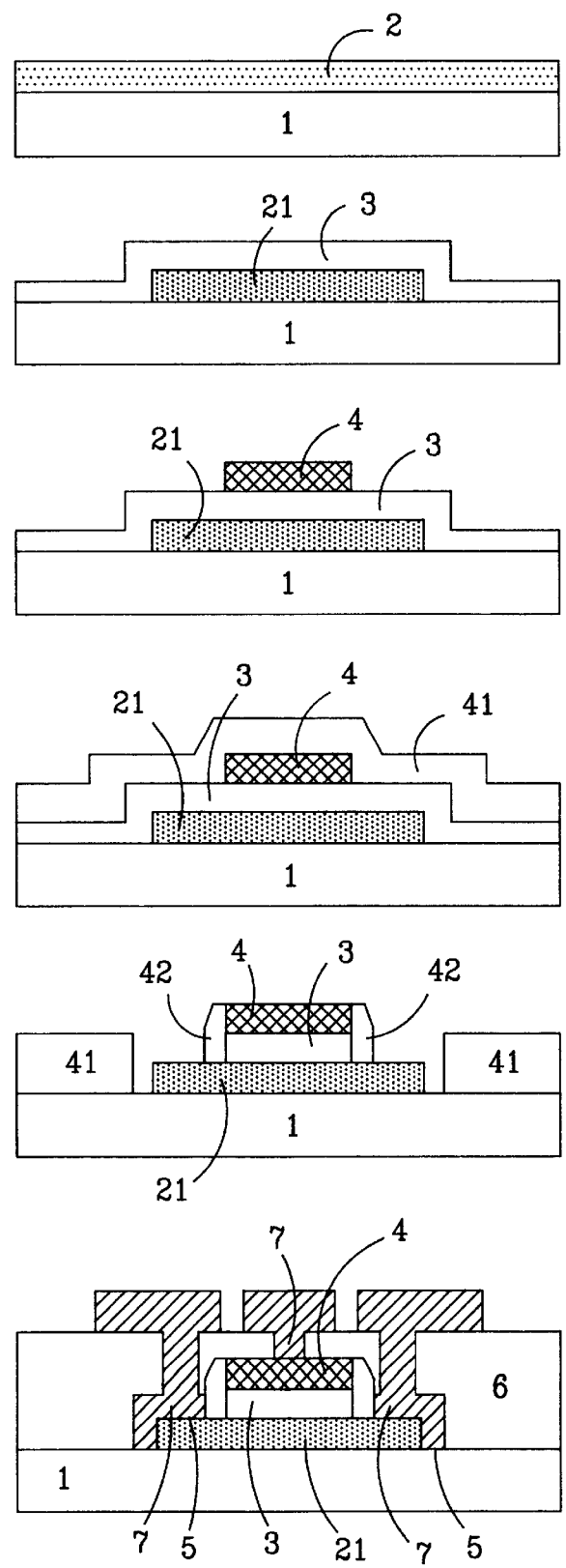

1 . . . dielectric substrate
2 . . . channel material
21 . . . channel surface
3. gate dielectric layer
4. gate
41 . . . Silicon oxide layer
42 . . . spacer
5. $n^+$or $p^+$region
6. insulation dielectric layer
7. contacting region In oder to illustrate more clearly about the technology and the effectiveness of this invention, the following schematic figures are used for detailed descriptions:

Generally, the UHV/CVD system is used for growing the polycrystalline silicon(poly-Si) and polycrystalline silicon-germanium(poly-$Si_{1-x}$-$Ge_x$) thin film transistors under low temperature, 550° C. without any anneal treatment step. Due to the extreme low base-pressure and ultra clean growth environment, the grown poly-Si and poly-$Si_{1-x}$-$Ge_x$ thin film transistors possess a lower defects density. However, this film surface morphology is still bad. So, it is not suitable to be used in fabricating the top-gate film transistors. This invention, uses the UHV/CVD system and chemical mechanical polishing (CMP) system for fabricating poly-Si and poly-$Si_{1-x}$-$Ge_x$ thin film transistors at low temperature and low thermal budget. And due to the ultra low base pressure and ultra clean growth environment, the as-deposited poly films have low defect densities. However, the surface morphology retards the usage of the fabricating top-gate poly TFT's. In this invention, the CMP system is used for improving the surface morphology, high performance poly-Si and poly-$Si_{1-x}$-$Ge_x$ TFT's can be obtained.

As shown in FIG. 1(a), at first, the UHV/CVD system is adopted for depositing a poly-Si and poly-$Si_{1-x}$-$Ge_x$ film layer on the surface of the insulation dielectric substrate (1) using as the channel material (2), and then the CMP system is used for polishing and reducing the surface roughness of the channel material, then a gate dielectric layer (3) is formed on the polished channel surface (21) after the active region is defined, a poly-Si and poly-$Si_{1-x}$-$Ge_x$ film layer used as the gate material is deposited over the gate dielectric layer (3) by the UHV/CVD system, thus the gate (4) is defined. And a further step, the gate, source and drain formed the $n^+$or $p^+$regions (5) by the n-type doping or p-type doping, then, depositing an insulation dielectric layer (6) and defining the contacting hole, finally, the metal layer deposited on the upper side of the dielectric layer and the contacting region (7) of the gate, source and drain can be defined.

As shown in FIG. 1 (b), at first, the UHV/CVD system is adopted for depositing a poly-Si and poly-$Si_{1-x}$-$Ge_x$ film layer used as the channel material (2) on the surface of the insulation dielectric substrate (1), and then the CMP system is used for polishing and reducing the surface roughness of the channel material, then a gate dielectric layer (3) is formed on the polished channel surface (21) after the active region defined, a poly-Si and poly-$Si_{1-x}$-$Ge_x$ film layer used as the gate material is deposited over the gate dielectric layer (3) by the UHV/CVD system, thus the gate (4) is defined. And the following step, a $SiO_2$ layer (41) is deposited under low temperature and formed the spacer (42) of the gate side wall through the anisotropic plasma etching procedure, in the further step, the UHV/CVD system is used for the selective growth of the recess sources, drains that are high concentration dopings, thus the $n^+$or $p^+$region will form. And then depositing a insulation dielectric layer (6) and defining the contacting hole, finally, the metal layer deposited on the upper side of the dielectric layer and the contacting region (7) of the gate, source and drain can be defined.

As description above mentioned, the UHV/CVD system is adopted for depositing a poly-Si and poly-$Si_{1-x}$-$Ge_x$ film layer which is used as channel material (2) on the surface of the insulation dielectric substrate (1), this channel material can be single layer or multilayer structure. The UHV/CVD system is adopted at first for depositing a poly-Si and poly-$Si_{1-x}$-$Ge_x$ film layer on the surface of the insulation dielectric substrate, and then the CMP system is used for polishing the grown poly-Si and poly-$Si_{1-x}$-$Ge_x$ film and reducing the surface roughness of the channel. However, the UHV/CVD system is also combined other grinding techniques in this invention, for example. In order to be able to improve the equability of the grinded poly-Si and poly-$Si_{1-x}$-$Ge_x$ film channel surface, the plasma etching is in situ used before the ginding step.

In this invention, a gate dielectric layer (3) is formed on the polished channel surface (21) after the active region defined, this gate dielectric layer can use the $SiO_2$, $Si_3N_4$ or $Al_2O_3$, and SiNO or other materials as the dielectric materials, but the oxidation, nitrogenation, deposition or dipping methods can be selected to form the dielectric layers.

In this invention, the defined active region and gate used the poly-Si and poly-$Si_{1-x}$-$Ge_x$ film that is deposited by the UHV/CVD system under low temperature as material, and proceeding the etching definition with plasma method. But the formation of the n+or p+regions of gate, source and drain (5) is to apply the ion implant, plasma doping, laser assisted ion doping or gas source doping technologies. This n+or p+region formed the selective growth assisting the in situ doping technics.

Figure 2A:
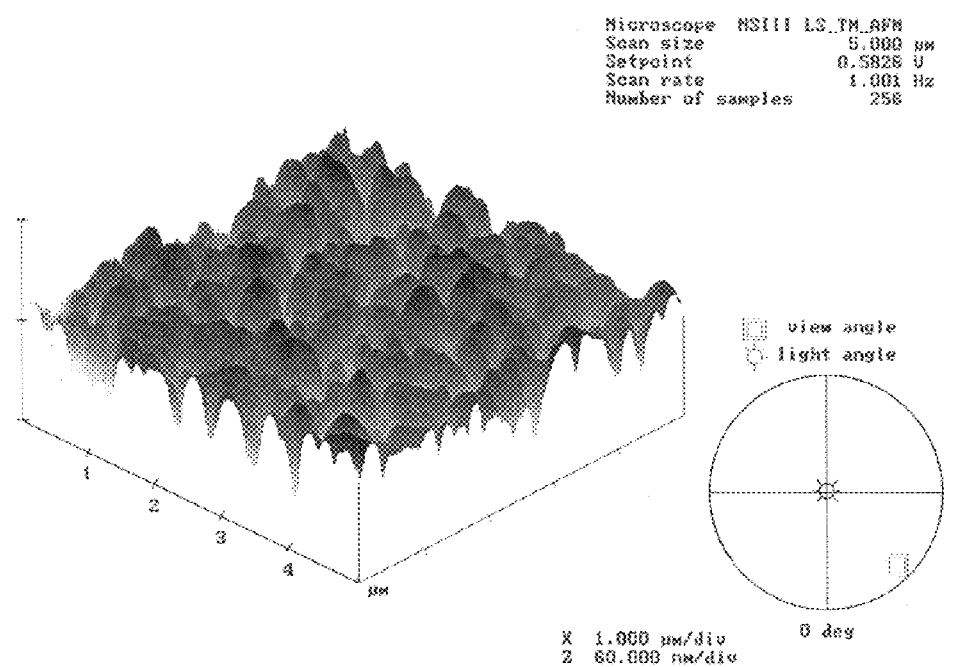
FIG. 2A. Atomic force microscopy: unpolished
FIG. 2B. Atomic force microscopy: polished
FIGS. 3A and 3B. The comparison of the film transistors characteristics (a). p- channel
1. Vd = −0.1V unpolished    2. Vd = −5.0V unpolished
3. Vd = −0.1V polished      4. Vd = −5.0V polished
(b). n- channel
1. Vd = −0.1V unpolished    2. Vd = −5.0V unpolished
3. Vd = −0.1V polished      4. Vd = −5.0V polished
Figure 2B:
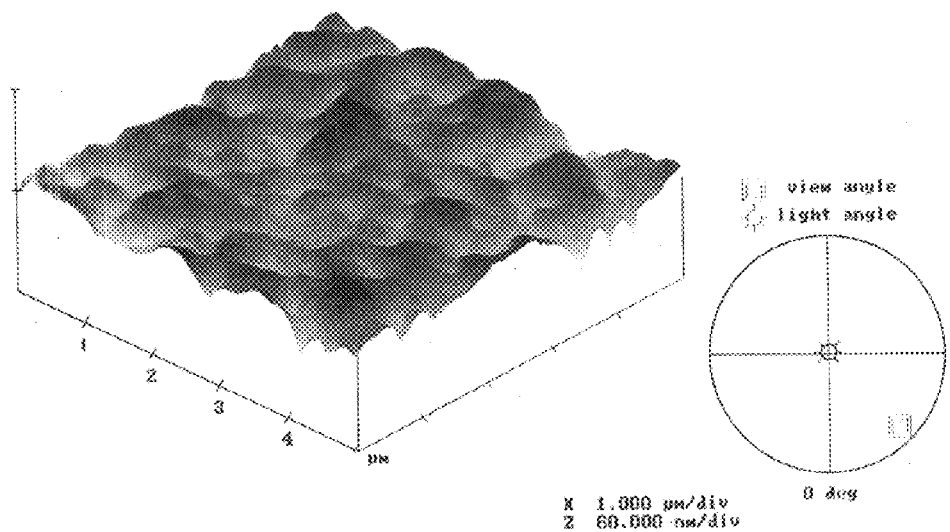
Figure 3A:
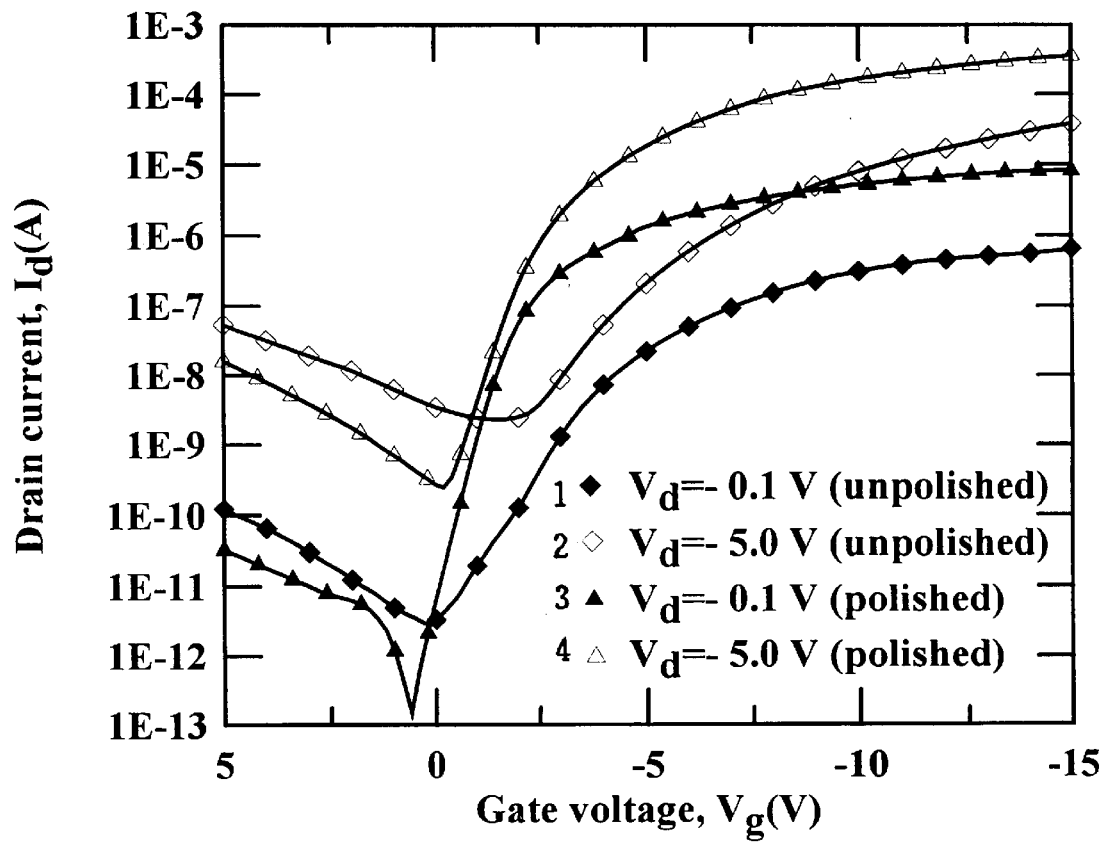
Figure 3B:
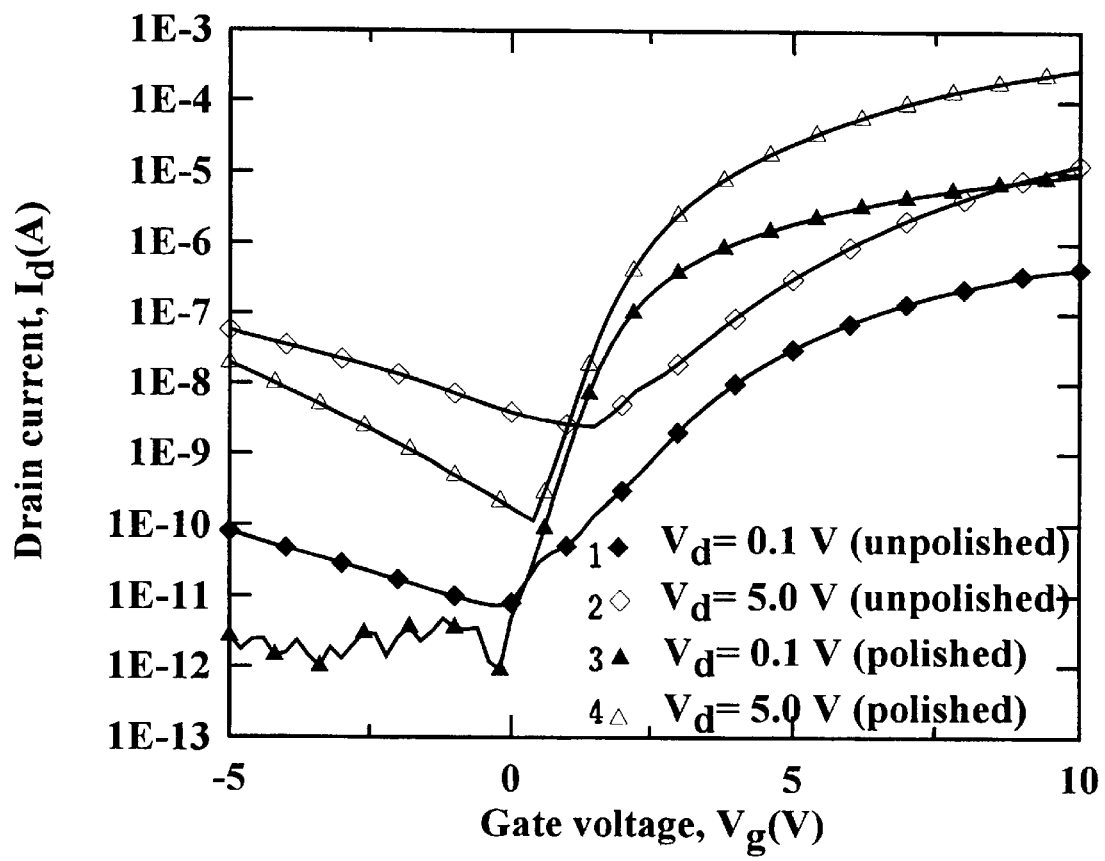

According to this invention, the atomic force microscopy of the prepared poly-Si and poly-$Si_{1-x}$-$Ge_x$ film that is used as the channel material is shown as FIGS. 2A and 2B, the roughness is investigated, FIG. 2A: the surface average roughness of the unpolished is 9.0 nm, FIG. 2B: the surface average roughness of the polished is 3.6 nm. But the characteristics of the prepared transistor channels which include p channel and n channel is shown in FIGS. 3A and 3B, the ratio of the channel width to length W/L =100 $\mu$m/10 $\mu$m.

In order to illustrate the propsed purposes, methods and advantages of this invention more obviously, the following implemented examples are stated concretely, but the extents of this invention are not limted by its contents and conclusions.

EXAMPLE 1

A 100–300 nm poly-Si layer (2) is deposited over the glass or $SiO_2$ substrate with the UHV/CVD system under 650° C. condition, and then it is polished to 50–200 nm by the CMP method. The poly-Si is etched to the active region with the plasma etching operation, the grown 10–50 nm $SiO_2$ under below 600° C. is used as the gate dielectric layer. In the further step, under below 650°C., a 100–500 nm poly-Si layer deposited with the UHV/CVD system. The plasma etching is adopted for defining the gate, and the gates, sources and drains formed $n^+$or $p^+$region under over 500° C. condition after processed the ion implant. A 200–500 nm $SiO_2$ layer that is used as the dielectric layer is deposited under 200–400 °C. by the plasma assisted chemical gas deposition method. Finally, the contacting hole formed by the etching and the contacting region (7) of the gate, source and drain can be obtained again by etching after the metal deposited.

EXAMPLE 2

A 100–300 nm poly-Si layer (2) is deposited over the glass or $SiO_2$ substrate with the UHV/CVD system under 650° C. condition, and then it is polished to 50–200 nm by the CMP method. The poly-Si is etched to the active region with the plasma etching operation, the grown 10–50 nm $SiO_2$ under below 600° C. is used as the gate dielectric layer. In the further step, under below 650°C., a 100–500 nm poly-Si layer deposited with the UHV/CVD system. The plasma etching is adopted for defining the gate, and further more, a $SiO_2$ layer deposited under low temperature and formed the spacer (42) of the gate side wall by the anisotropic plasma etching procedure, the UHV/CVD system is used for the selective growth of the recess sources, drains that are high concentration dopings, thus the $n^+$or $p^+$region will form. A 200–500 nm $SiO_2$ layer that is used as the dielectric layer is deposited under 200–400° C. by the plasma assisted chemical gas deposition method. Finally, the contacting hole formed by the etching and the contacting region of the gate, source and drain can be obtained by adopting etch after the metal deposited.

What is claimed:

1. A method for fabricating a thin film transistor comprising the steps of:

depositing poly-Si or poly-$Si_{1-x}$-$Ge_x$ on an insulation dielectric layer using a UHV/CVD system to form a channel, polishing and reducing a surface roughness of the channel using a CMP system, forming a gate dielectric layer on the polished channel, depositing a gate of either poly-Si or poly-$Si_{1-x}$-$Ge_x$ on the gate dielectric layer using the UHV/CVD system, depositing under low temperature a $SiO_2$ layer to form a spacer of a gate sidewall, anisotropic plasma etching the $SiO_2$ layer, selectively growing high dopant concentration source and drain regions in a recess formed by the anisotropic plasma etching, depositing an insulation dielectric layer covering the gate dielectric layer and the gate, defining two contact holes through the insulation dielectric layer and the gate dielectric layer, and another contact hole through the insulation dielectric layer, and depositing metal into each of the contact holes to form contacting regions for the gate, source, and drain;

wherein the source contacting region is connected to the drain contacting region through the polished channel.

2. The method according to claim 1, wherein the channel is a multilayer structure.

3. The method according to claim 1, wherein the material for the gate dielectric layer is selected from a group of $SiO_2$, $Si_3N_4$, $Al_2O_3$, and SiNO.

4. The method according to claim 1, further comprising the step of preparing the dielectric layers using one of the following methods: oxidation, nitrogenation, deposition, or dipping.

5. The method according to claim 1, further comprising the step of doping the gate, the source, and the drain using one of the following: ion implanting, plasma doping, laser assisted ion doping, or gas source doping.

6. The method according to claim 1, further comprising the step of in situ doping.

* * * * *